United States Patent [19]

Tokushige et al.

[11] 4,403,306
[45] Sep. 6, 1983

[54] SEMICONDUCTOR MEMORY OPERABLE AS STATIC RAM OR EAROM

[75] Inventors: Kaoru Tokushige, Yokohama; Masayoshi Nakane, Ayase, both of Japan

[73] Assignee: Tokyo Shibaura Denki Kabushiki Kaisha, Japan

[21] Appl. No.: 311,923

[22] Filed: Oct. 16, 1981

[30] Foreign Application Priority Data

| Oct. 22, 1980 [JP] | Japan | 55-147904 |
| Oct. 22, 1980 [JP] | Japan | 55-147910 |
| Oct. 22, 1980 [JP] | Japan | 55-147911 |
| Oct. 22, 1980 [JP] | Japan | 55-147912 |
| Oct. 22, 1980 [JP] | Japan | 55-147913 |

[51] Int. Cl.$^3$ ............................................. G11C 11/40
[52] U.S. Cl. ..................................... 365/156; 365/228; 365/184
[58] Field of Search ...................... 365/156, 184, 228; 357/23 VT; 307/279

[56] References Cited

U.S. PATENT DOCUMENTS

| 3,950,737 | 4/1976 | Uchida et al. | 340/173 |
| 4,044,343 | 8/1977 | Uchida et al. | 340/173 |
| 4,175,290 | 11/1979 | Harari | 365/156 |
| 4,287,574 | 9/1981 | Uchida | 365/156 |

Primary Examiner—Stuart N. Hecker
Attorney, Agent, or Firm—Finnegan, Henderson, Farabow, Garrett & Dunner

[57] ABSTRACT

A semiconductor memory comprises a CMOS flip-flop circuit and a pair of N-channel MNOS (Metal Nitride Oxide Semiconductor) transistors. A first MNOS transistor is connected between a first pair of CMOS transistors and a second MNOS transistor is connected between a second pair of CMOS transistors. The gates of the first and second MNOS transistors are connected to a control signal line. The control signal line is normally maintained at a reference voltage. When an erase pulse of first polarity is supplied to the control signal line, the first and second MNOS transistors are turned ON, so that the memory operates in the static RAM mode. When a write pulse of second polarity is supplied to the control signal line, the data stored in the static RAM mode becomes nonvolatile.

3 Claims, 4 Drawing Figures

SEMICONDUCTOR MEMORY OPERABLE AS STATIC RAM OR EAROM

BACKGROUND OF THE INVENTION

The present invention relates to a semiconductor memory which functions as a static random access memory (RAM) or an electrically alterable read-only memory (EAROM).

In general, semiconductoor memories are classified into random access memories (referred to as RAMs hereinafter) and read-only memories (referred to as ROMs hereinafter). The RAM is a read/write memory in which data-write and data-readout can be freely achieved, while the ROM is a memory used only for data readout. The RAM and ROM are utilized in accordance with their functions. In a microcomputer, for example, a RAM is used for storing information that is often altered, if required, while a ROM is used for storing data such as a program which is not changed.

A RAM constituted by a semiconductor integrated circuit is essentially a volatile memory that cannot hold stored data when electric power is interrupted. On the other hand, the ROM is a nonvolatile memory that can hold stored data even if electric power is interrupted.

However, in addition to the conventional limited applications of the RAM and ROM, it is often required that stored data can be altered and made nonvolatile. For this purpose, ROMs have been developed which have the inherent nonvolatile property and can alter stored data if required. Of such ROMs, an EAROM (electrically alterable ROM) has an advantage in that stored data can be electrically erased without using an ultraviolet ray generator.

The EAROM utilizes, as memory cells, MNOS (Metal Nitride Oxide Semiconductor) transistors which have a silicon nitride film and a silicon oxide film between a gate electrode and a semiconductor substrate and can store electrons in the interface of both films. In case of a memory using MNOS transistors, write, readout, and erasure of data are performed by applying voltages to the gate electrodes of MNOS transistors. Therefore, data which has been written into MNOS transistors do not volatilize even if power is interrupted and can be read out after application of power.

As described above, the EAROM can operate in the same manner as the RAM. However, as compared with the RAM, the readout speed and especially the write speed are extremely slow. Further, in the EAROM, data stored in the memory cells cannot be selectively erased from cell to cell. Therefore, the EAROM cannot be essentially used as a RAM.

SUMMARY OF THE INVENTION

An object of the present invention is to provide a semiconductor memory in which a RAM function or an EAROM function may be selectively performed by utilizing positive and negative control pulses, in which power dissipation is small, and in which data-write and data-readout are performed with a single power source.

A memory embodying the present invention comprises a first series circuit and a second series circuit which are connected in parallel across a DC power supply. The first series circuit includes a first MOS transistor of P-channel type, a first diode which is poled in the forward direction with respect to the polarity of the DC power supply, a first MNOS transistor of N-channel type and a second MOS transistor of N-channel type which are connected in series; and the second series circuit includes a third MOS transistor of P-channel type, a second diode which is poled in the forward direction with respect to the polarity of the DC power supply, a second MNOS transistor of N-channel type, and a fourth MOS transistor of N-channel type which are connected in series.

The gates of the first and second MOS transistors are connected to a connection point (second output) between the second MNOS transistor and the fourth MOS transistor, while the gates of the third and fourth MOS transistors are connected to a connection point (first output) between the first MNOS transistor and the second MOS transistor. A fifth MOS transistor of N-channel type having its gate connected to a word line is connected between the first output and a first digit line. A sixth MOS transistor of N-channel type having its gate connected to the word line is connected between the second output and a second digit line. The gates of the first and second MNOS transistors are connected together to a control pulse signal line.

With the memory configured as described above, the control signal line is normally maintained at a reference voltage (0 volt). When a negative erase pulse (of a magnitude much larger than the power supply voltage) is supplied to the control signal line, the first and second MNOS transistors are rendered conductive. The memory thus operates as a static RAM consisting of a CMOS flip-flop. On the other hand, when a positive write pulse (of a magnitude much larger than the power supply voltage) is supplied to the control signal line, data stored in the RAM mode are stored in the first and second MNOS transistors. Namely, stored data are made nonvolatile.

As described, above, the memory according to the present invention can operate as a static RAM or ROM in response to a negative or positive control pulse applied to the control pulse signal line. Data can be written into the static RAM at high speed, and the written data can be made nonvolatile at high speed by the write pulse having a fairly narrow pulse width. The memory according to the present invention is basically arranged in a CMOS configuration, so that the memory operates from a single DC power supply and power dissipation is extremely small.

DETAILED DESCRIPTION OF THE PREFERRED EMBODIMENT

Figure 1:
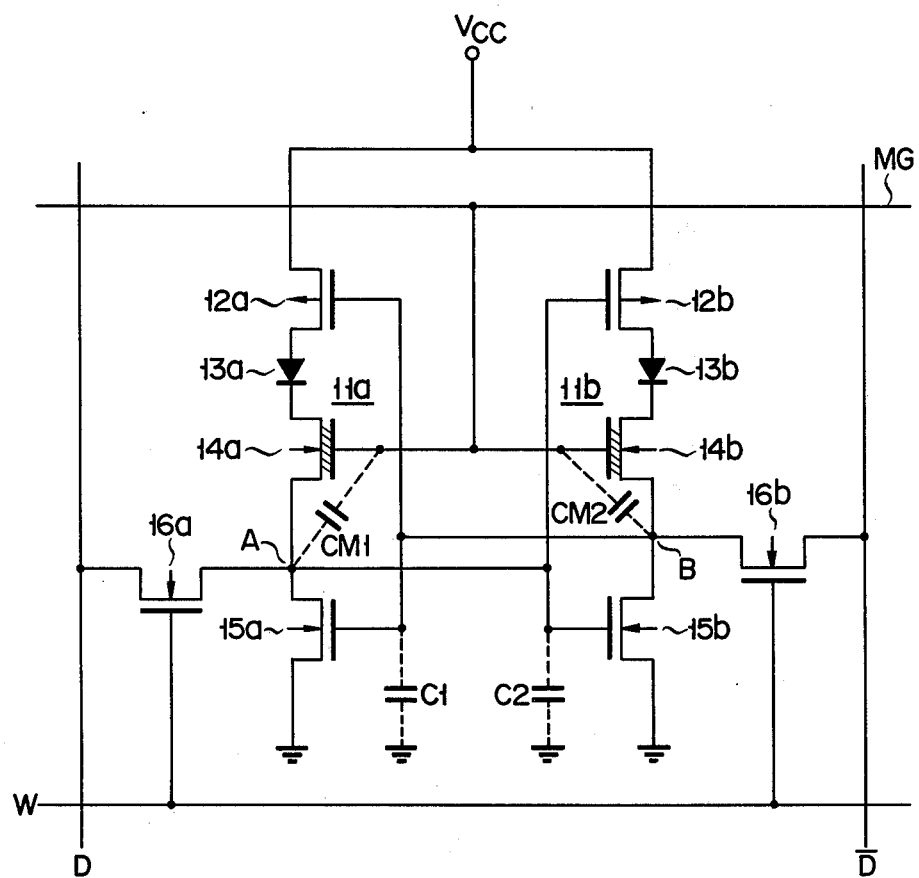
FIG. 1 is a circuit diagram of a semiconductor memory embodying the present invention.

Referring to FIG. 1, there is shown a nonvolatile memory cell embodying this invention which is formed of a static RAM constituted by CMOS transistors, and MNOS transistors.

The memory cell of this invention comprises, as shown in FIG. 1, first and second series circuits 11a and 11b which are connected in parallel between a DC power supply Vcc (e.g. +5 volts) and ground. The first series circuit 11a includes a P-channel MOS (referred to as P-MOS hereinafter) transistor 12a, a diode 13a, an N-channel MOS (referred to as N-MOS hereinafter) transistor 14a and an N-channel MOS (referred to as the N-MOS hereinafter) transistor 15a which are connected in series as shown. The second series circuit 11b comprises a P-MOS transistor 12b, a diode 13b, an N-MNOS transistor 14b and an N-MOS transistor 15b which are all connected in series as shown.

A connection point A (first output of the memory cell) between N-MNOS transistor 14a and the N-MOS transistor 15a is connected to the gates of P-MOS transistor 12b and N-MOS transistor 15b, while a connection point B (second output of the memory cell) between N-MNOS transistor 14b and N-MOS transistor 15b is connected to the gates of P-MOS transistor 12a and N-MOS transistor 15a. With such an arrangement, when N-MNOS transistors 14a and 14b are ON, P-MOS transistors 12a and 12b and N-MOS transistors 15a and 15b form a flip-flop circuit (static RAM) constituted by cross-coupled CMOS inverters.

An N-MOS transistor 16a having its gate connected to a word line W is connected between the first output A and a first digit line D, while an N-MOS transistor 16b having its gate connected to the word line is connected between the second output B and a second digit line $\overline{D}$. The gates of N-MNOS transistors 14a and 14b are connected to a control signal line MG.

With the memory cell as described above, nonvolatile data is stored by utilizing the hysterisis characteristics of a threshold voltage Vth of N-MNOS transistors 14a and 14b. More specifically, the nonvolatile data is stored in such a manner that one of the N-MNOS transistors 14a and 14b operates as a depletion mode transistor (having a negative threshold voltage) which conducts when its gate voltage is 0 volt, while the other transistor operates as an enhancement mode transistor (having a positive threshold voltage) which is nonconductive when its gate voltage is 0 volt. In this embodiment, the DC power supply voltage is +5 V, and an erase pulse of about −28 V (with a pulse width of about 1 ms) is supplied to the control signal line MG to erase nonvolatile data. A write pulse (with a pulse width of 1 ms) of about +28 V is applied to the control signal line MG to write nonvolatile data, or make data stored in the RAM mode nonvolatile. The control signal line MG is normally maintained at 0 volt.

When the power supply voltage is applied to the memory cell in a condition in which the memory cell stores nonvolatile data, the memory cell operates in the ROM mode. The nonvolatile data stored in the form of the different threshold voltages of N-MNOS transistors 14a and 14b appears at the first and second outputs A and B as different voltage levels (one is about 5 volts; the other is about 0 volt). The nonvolatile data is read out to data lines D and $\overline{D}$ through transistors 16a and 16b by raising the level of word line W.

In order to erase the nonvolatile data stored in N-MNOS transistors 14a and 14b, an erase pulse of about −28 V is supplied from control signal line MG to the gates of N-MNOS transistors 14a and 14b. The N-MNOS transistors 14a and 14b becomes depletion mode transistors which have a negative threshold voltage. Therefore, when the gate voltage is 0 V, transistors 14a and 14b are rendered conductive and operate as elements having a small resistance. In this condition, the memory cell acts as a static RAM constituted by CMOS transistors. Therefore, readout and write of data are performed, as usually, through word line W and digit lines D, $\overline{D}$. The nonvolatile data stored in N-MNOS transistors 14a and 14b is made volatile in such a way that the nonvolatile data is transferred to the CMOS flip-flop circuit by applying an erase pulse to the gates of transistors 14a and 14b. The volatile data stored by the flip-flop circuit can be read out unless new data is written.

Data stored in the memory cell in the RAM mode is volatile. The conversion of volatile data stored in RAM cell into nonvolatile data will be described.

Assume that, to write data "1", signal voltages are supplied to digit lines D and $\overline{D}$ so that the first output A goes to a voltage VO (about 5 V) and the second output B goes to the reference voltage (0 V). With stray capacitances C1 and C2 respectively associated with the gates of transistors 15a and 15b as shown, the capacitance C2 charges up to the voltage VO while the capacitance C1 discharges. At this moment, when a write pulse is supplied from control signal line MG to the gates of transistors 14a and 14b, the transistors 14a and 14b turn ON. With stray capacitances CM1 and CM2 respectively associated with the gates of transistors 14a and 14b as shown, a voltage VA at the first output A is given by $$VA = [CM1/(CM1+C2)] \cdot VMGM + VO \quad (1)$$

where VMGW is the voltage of write pulse. Since the capacitance C2 is charged to voltage VO and thus transistor 15b is ON, a voltage VB at the second output B is given by $$VB = 0 \ V \quad (2)$$

Therefore, a channel voltage of N-MNOS transistor 14a increases to the voltage VA in equation (1) due to the presence of diode 13a. The diode 13a is provided for preventing a decrease in voltage VA by a PN junction formed by the source (P-type) and the substrate (N-type) of P-MOS transistor 12a.

A channel-to-gate voltage $V_{C-G14a}$ of N-MNOS transistor 14a is given by $$V_{C-G14a} = VMGW - VA = [1 - CM1/(C2+CM1)] \cdot VMGW - VO \quad (3)$$

With CM1 = C2, $$V_{C-G14a} = \tfrac{1}{2} VMGW - VO = 9 \ V \quad (4)$$

Namely, the voltage $V_{C-G14a}$ is considerably lower than the write pulse voltage (+28 V) so that transistor 14a remains in the depletion mode when the erase pulse voltage (−28 V) is applied.

Since the transistor 15b is ON, on the other hand, a channel-to-gate voltage $V_{C-G14b}$ of transistor 14b is given by $$V_{C-G14b} = VMGW = +28 \ V \quad (5)$$

Therefore, transistor 14b is converted from a depletion mode transistor to an enhancement mode transistor which is in the OFF state when the gate voltage is 0 V. Therefore, it will be understood that the memory cell stores data "1" in such a way that transistors 14a and 14b become depletion and enhancement mode transistors, respectively. Even if electric power is interrupted, the state of transistors 14a and 14b does not change unless an erase pulse is supplied through control signal line MG again. In this way, volatile data written in the RAM mode is made nonvolatile. When electric power is applied, the state of transistors 14a and 14b does not change, and the memory cell is set in the state in which data is written. Namely, the memory cell functions as an EAROM. Data-readout operation is performed in the same manner as in a conventional ROM, while keeping control signal line MG at the reference voltage (0 V).

The mode of operation of the memory cell arranged as described above will be described with reference to FIGS. 2 to 4.

Figure 2:
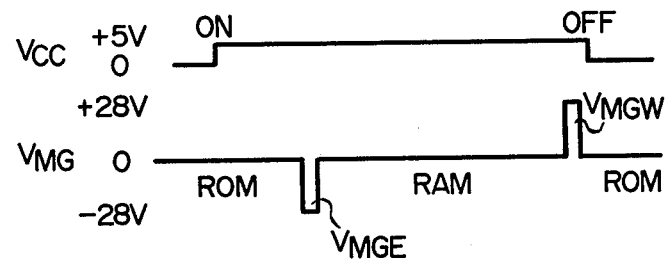
FIGS. 2 to 4 are timing charts for explaining the mode of operation of the memory according to the present invention.

As shown in FIG. 2, if electric power is applied, nonvolatile data can be read out of the memory acting as a ROM. In this condition, if a negative erase pulse VMGE is supplied to N-MNOS transistors 14a and 14b, the nonvolatile data stored in transistors 14a and 14b is erased as described above so that the memory acts as a static RAM into which new data can be written. Data stored in the static RAM is inherently volatile and may be erased when electric power is interrupted. In order to retain the data in the memory even after electric power is interrupted, it is only required that a positive write pulse VMGW be supplied to the gates of transistors 14a and 14b immediately before the interruption of electric power. Thus, the data is made nonvolatile and can be hold even after electric power is interrupted. In this way, the memory cell according to the present invention also functions as a nonvolatile static RAM. Data can be written into the static RAM at high speed. The data can be made nonvolatile at high speed by supplying a positive write pulse VMGW of a 1 ms pulse width as described above.

Figure 3:
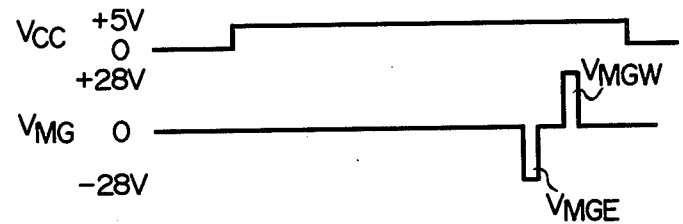

As shown in FIG. 3, while the power supply voltage is supplied to the memory, the negative erasing pulse VMGE and the positive writing pulse VMGW may be applied to control signal line MG as required, so that the operating modes of the memory cell may be changed.

Figure 4:
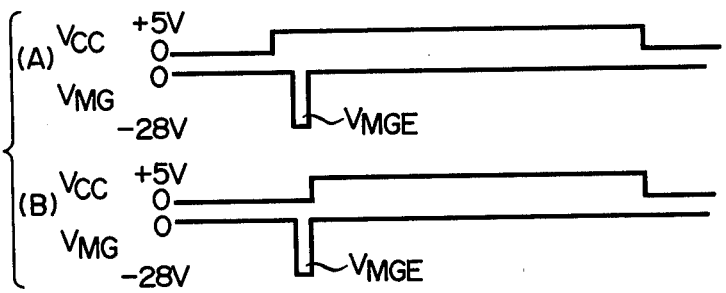

As shown in FIG. 4, after electric power is turned ON (FIG. 4A), or immediately before electric power is turned ON (FIG. 4B), the negative erase pulse VMGE may be supplied to the gates of N-MNOS transistors 14a and 14b, so that the memory cell operates in the static RAM mode.

What we claim is:

1. A semiconductor memory comprising:
   a first series circuit and a second series circuit which are connected in parallel across a power supply, said first series circuit having a first MOS transistor of P-channel type, a first diode which is poled in the forward direction with respect to the polarity of a power supply voltage, a first MNOS transistor of N-channel type and a second MOS transistor of N-channel type which are connected in series, said second series circuit having a third MOS transistor of P-channel type, a second diode which is poled in the forward direction with respect to the polarity of the power supply voltage, a second MNOS transistor of N-channel type and a fourth MOS transistor of N-channel type which are connected in series, a connection point between said first MNOS transistor and said second MOS transistor being connected to gates of said third and fourth MOS transistors and a connection point between second MNOS transistor and said fourth MOS transistor being connected to gates of said first and second MOS transistors;
   first and second digit lines;
   a word selection line;
   a fifth MOS transistor of N-channel type connected between said first digit line and said connection point between said first MNOS transistor and said second MOS transistor and having its gate connected to said word selection line;
   a sixth MOS transistor of N-channel type connected between said second digit line and said connection point between said second MNOS transistor and said fourth MOS transitsor and having its gate connected to said word selection line; and
   a control signal line connected to gates of said first and second MNOS transistors.

2. A semiconductor memory cell according to claim 1, wherein said control signal line is normally maintained at a reference voltage, and said memory cell is arranged to operate in a static RAM mode in response to application of an erase pulse of first polarity to said control signal line.

3. A semiconductor memory cell according to claim 1, wherein said control signal line is normally maintained at a reference voltage, and said memory cell is arranged to operate in a static RAM mode in response to application of an erase pulse of first polarity to said control signal line, and to make data stored in the RAM mode nonvolatile in response to application of a write pulse of second polarity to said control signal line.

* * * * *